United States Patent [19]

Matthews

[11] Patent Number: 5,604,467
[45] Date of Patent: Feb. 18, 1997

[54] TEMPERATURE COMPENSATED CURRENT SOURCE OPERABLE TO DRIVE A CURRENT CONTROLLED OSCILLATOR

[75] Inventor: Wallace E. Matthews, Richardson, Tex.

[73] Assignee: Benchmarq Microelectronics, Dallas, Tex.

[21] Appl. No.: 16,439

[22] Filed: Feb. 11, 1993

[51] Int. Cl.$^6$ .................................................. H03L 1/02
[52] U.S. Cl. .......................................... 331/176; 323/907
[58] Field of Search .................. 331/176, 66; 330/288, 330/289; 323/315, 316, 907

[56] References Cited

U.S. PATENT DOCUMENTS

| | | | |
|---|---|---|---|
| 4,139,798 | 2/1979 | Hoover | 323/907 |
| 4,556,807 | 12/1985 | Yamada et al. | 307/491 |
| 4,769,589 | 9/1988 | Rosenthal | 323/315 |
| 4,899,152 | 2/1990 | Barrow et al. | 341/154 |
| 4,978,930 | 12/1990 | Suter | 331/176 |
| 5,162,678 | 11/1992 | Yamasaki | 307/491 |
| 5,180,995 | 1/1993 | Hayashi et al. | 331/176 |

FOREIGN PATENT DOCUMENTS

| | | | |
|---|---|---|---|
| 1-103313 | 4/1989 | Japan | 331/176 |

OTHER PUBLICATIONS

"MOS Amplifier Design" ( p. 734) in *Analysis and Design of Analog Integrated Circuits* by Paul R. Gray and Robert G. Meyer, John Wiley & Sons, 1984. (Month unknown).

*Primary Examiner*—Andrew M. Dolinar
*Attorney, Agent, or Firm*—Gregory M. Howison

[57] ABSTRACT

A temperature compensated current source for driving a multi-vibrator (19) includes a voltage generator (10) that outputs a voltage that is proportional to absolute temperature (PTAT) and a resistor (12) for setting the current output by the voltage generator (10). The temperature coefficient of the resistor (12) is chosen such that any variations in the current supplied by the voltage generator (10) are compensated for to result in a current that has substantially no temperature variation. This current is mirrored to a current source (18) for driving the multi-vibrator (19). The voltage across the resistor (12) is a function of temperature, with the current being a function of the value of the resistor (12). The temperature coefficient of the resistor (12) is substantially equal to the temperature coefficient of the voltage generator (10) to yield a temperature coefficient of substantially 0 ppm/°C. for the current.

7 Claims, 2 Drawing Sheets

TEMPERATURE COMPENSATED CURRENT SOURCE OPERABLE TO DRIVE A CURRENT CONTROLLED OSCILLATOR

TECHNICAL FIELD OF THE INVENTION

The present invention pertains in general to temperature compensated current sources and, more particularly, to a current source that temperature compensates a current that is proportional to absolute temperature.

BACKGROUND OF THE INVENTION

Temperature compensated current sources have been utilized for numerous applications. One primary application is to provide compensation for a current controlled oscillator. In these applications, a current source is utilized to supply current to one side of a capacitor. The voltage on the capacitor is then input to one side of a comparator, the output thereof providing a periodic waveform operating at a predetermined frequency. When the voltage on the capacitor rises above a predetermined threshold, the output state of the comparator switches, this switching operation discharging the capacitor, which is then charged up to the switching voltage again. The frequency of switching on the oscillator output is a function of the size of the capacitor and the current supplied thereto. This current is a constant current. However, temperature variations in the current that drives the capacitor will cause temperature variations in the frequency of the output waveform. Although there are some inherent temperature variations associated with the capacitor and the circuitry associated with the oscillator, the primary source of temperature variation in the output waveform is the current supplied to the capacitor.

A number of current sources have been utilized to provide for temperature compensated current. For example, in U.S. Pat. No. 4,978,930, a Temperature Proportional to Absolute Temperature (PTAT) is generated in addition to a temperature stable current. The PTAT current is then subtracted from the temperature stable current to provide an offset current. This offset current is inversely proportional to temperature. This offset current is utilized to offset a control signal voltage to form a tuning signal for an oscillator. However, this solution requires the generation of a temperature stable current in addition to the generation of the PTAT current. The temperature compensation is therefore dependent upon how accurately the temperature stable current be generated.

SUMMARY OF THE INVENTION

The present invention disclosed and claimed herein comprises a temperature compensated current source. The current source includes a voltage generator for generating a substantially constant voltage that varies as a function of temperature. The substantially constant voltage is disposed across an impedance device to drive current therethrough. The impedance device has a value that varies as a function of temperature, such that the value of the resistor will also define a corresponding variation in the current therethrough. A current mirror mirrors the current through an impedance device to a current source, the current through the current source directly proportional to the current through the impedance device.

In another aspect of the present invention, the impedance device comprises a resistor. The resistor is configured of two parallel resistors, each of the parallel resistors having a different temperature coefficient to provide an overall resultant temperature coefficient. The temperature coefficient of the voltage is the same polarity as the temperature coefficient of the resistor. In one embodiment, the temperature coefficients of the resistor and the voltage generator are substantially equal.

In a yet further embodiment of the present invention, the voltage generator is comprised of a supply-independent, current bias circuit that generates a current bias output that is mirrored to the current source. The current bias circuit includes a reference leg have a first diode associated therewith and for supplying a first current to the first diode. An output leg is provided having a second diode associated therewith and for supplying a second current to the second diode. The impedance device is disposed in series with the first diode with one side thereof connected to one terminal of the first diode. A current mirror device mirrors the first current to the second current to substantially equalize the two currents. A bias circuit translates the voltage on the second diode to the other side of the impedance device, the voltage across the impedance device constituting the substantially constant voltage which varies as a function of temperature.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
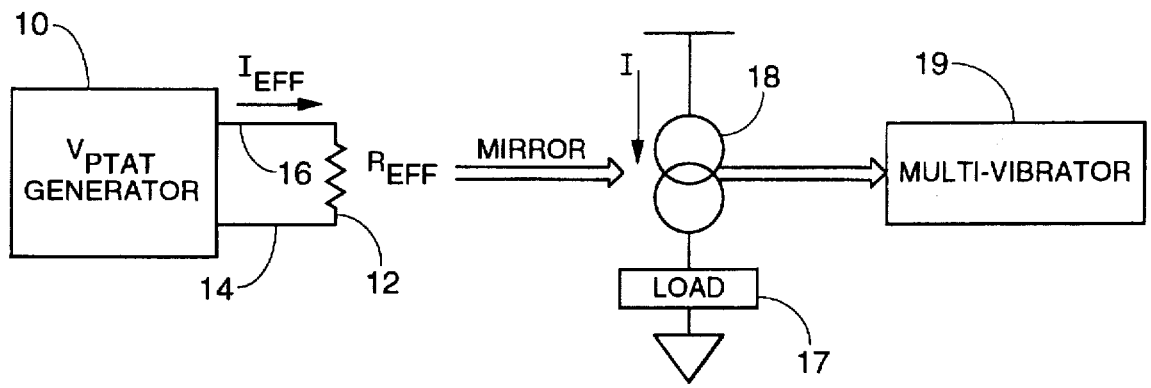
FIG. 1 illustrates a general block diagram of the temperature compensated current source of the present invention.

Referring now to FIG. 1, there is illustrated a generalized block diagram of the temperature controlled current source of the present invention. A voltage generator 10 is operable to generate a voltage that is Proportional To Absolute Temperature (PTAT). The generator 10 has a resistor 12 disposed across two output terminals 14 and 16. The voltage at a given temperature on the terminals 14 and 16 is constant such that the value of the resistor 12 determines the effective current $I_{EFF}$ therethrough. As will be described in more detail hereinbelow, the temperature coefficient of the resistor 12 is adjusted such that it compensates for any temperature variations in the voltage generator 10.

The current $I_{EFF}$ through the resistor 12 is mirrored to a current source 18, the current source 18 being disposed between the positive and negative rails with a load 17 associated therewith. The current through the current source 18 is determined as a function of the current that flows through the resistor 12. Therefore, as the current through resistor 12 changes, the current through current source 18 changes. As will be described hereinbelow, the temperature coefficient of resistor 12 is adjusted to completely offset any variations in the voltage output by the voltage generator 10 as a function of temperature, such that a zero temperature coefficient is realized. Therefore, a zero coefficient with respect to temperature through the current source 18 is also realized. The current source 18 is also utilized to drive a multi-vibrator 19, this comprising the load 17.

Figure 2:
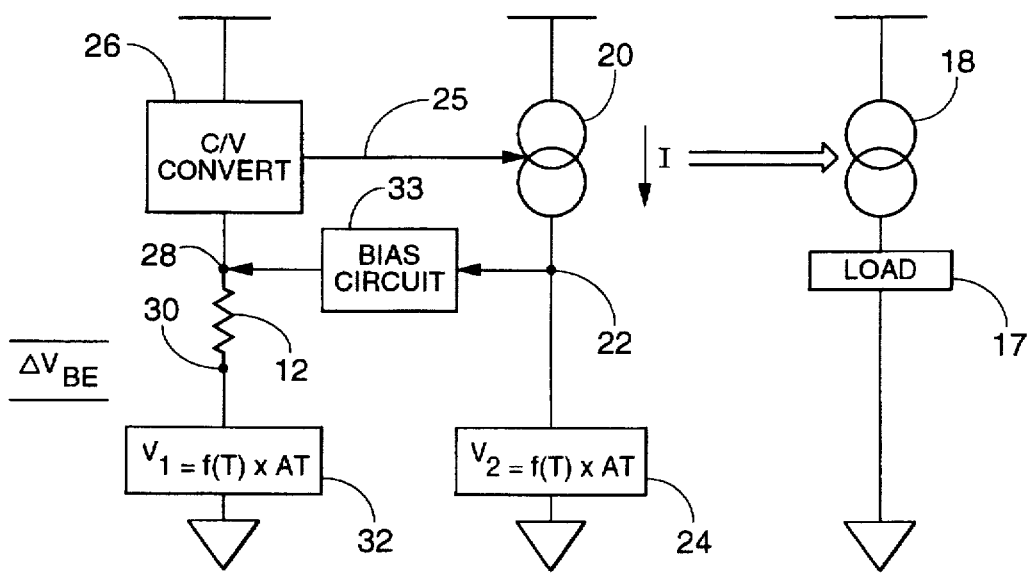
FIG. 2 illustrates a more detailed schematic view of the temperature compensated current source of the present invention.

Referring now to FIG. 2, there is illustrated a schematic representation of the voltage generator 10 and current source 18. A current source 20 is provided that is connected on one side to the positive rail and on the opposite side to a node 22. The node 22 is connected to one side of a voltage device 24 having a voltage relationship as follows:

$$V_2 = f(T) \propto \Delta T \tag{1}$$

The current source 20 is controlled by a bias voltage on a line 25 which is output by a current/voltage conversion circuit 26. The conversion circuit 26 has one side thereof connected to the positive rail and the other side thereof connected to a node 28. The node 28 is connected to one side of the resistor 12, the other side of resistor 12 connected to a node 30. Node 30 is connected to one side of a second voltage device 32, the other side thereof connected to ground. The second voltage device 32 has the following voltage relationship:

$$V_1 = f(T) \propto \Delta T \tag{2}$$

The node 22 is connected to the input of a bias circuit 33, the output thereof connected to the node 28. The bias circuit 33 is operable to reflect the voltage on the node 22 to the node 28 such that the voltage on node 22 is identical to the voltage on node 28.

In operation, the current drawn through the conversion circuit 26 is utilized to generate a control bias voltage to control the current through the path of the current source 20 such that they are substantially identical. The current through the conversion circuit 26 is set by the resistor 12, with the voltage across the resistor 12 and nodes 28 and 30 referred to as the voltage $\Delta V_{BE}$. As will be described hereinbelow, the voltage devices 24 and 32 utilize bi-polar devices and the ratio of the hi-polar devices determines what the voltage $\Delta V_{BE}$ is, and the value of the resistor 12 determines what the current is through the current source 20. The current through the current-to-voltage converter 26 is mirrored over to the current source 18, the current source 18 utilized to drive the load 17. The voltage $\Delta V_{BE}$ is a PTAT voltage such that the current therethrough is a PTAT current. The resistor 12 is chosen such that it has a temperature coefficient that is substantially equal to the temperature coefficient of the voltage, which will result in a substantially zero temperature coefficient current through current source 20, and subsequently a zero temperature coefficient for the current through the current source 18.

Figure 3:
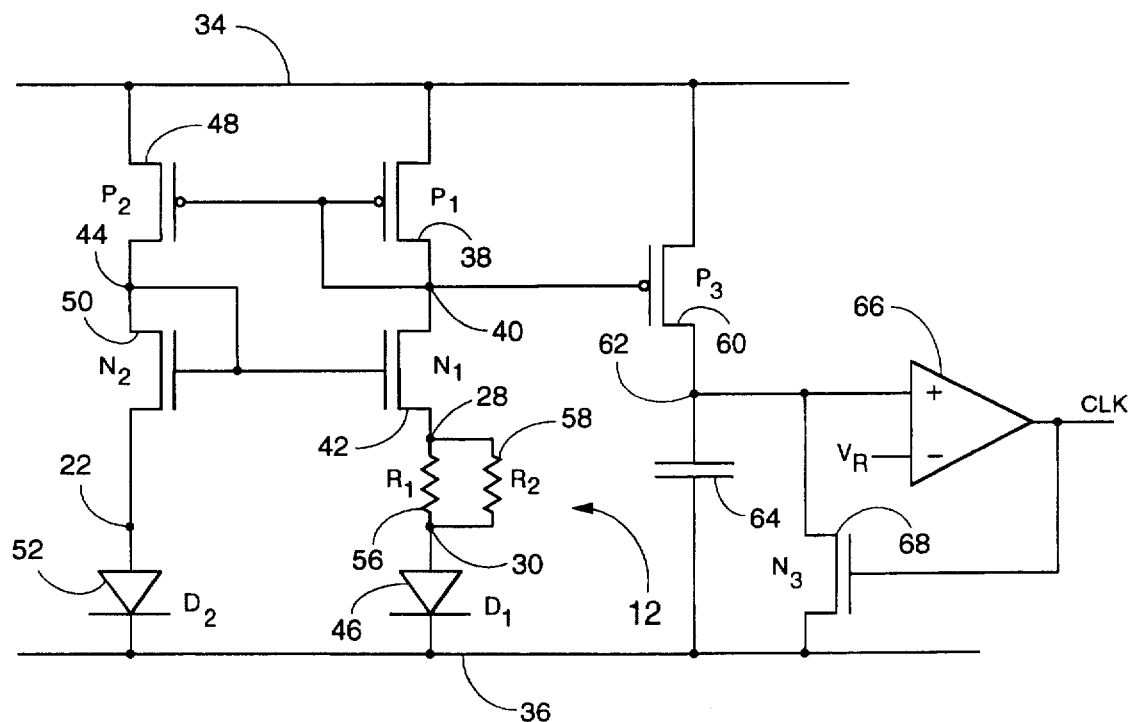
FIG. 3 illustrates a detailed schematic of the temperature compensated current source of the present invention.

Referring now to FIG. 3, there is illustrated a detailed schematic diagram of the temperature compensated current source of the present invention. A positive rail 34 and a negative rail 36 are provided. A first P-channel transistor 38 has the source/drain path thereof connected between the positive rail 34 and a node 40 and the gate thereof connected to a node 40. The transistor 38 is labelled P$_1$. A first N-channel transistor 42 has the source/drain path thereof connected between the node 40 and the node 28. The gate of transistor 42 is connected to a node 44. The transistor 42 is labelled N$_1$. A diode 46 has the anode thereof connected to node 30 and the cathode thereof connected to the negative rail 36. The diode 46 provides the functionality of the voltage device 26, and is labelled D$_1$.

A second P-channel transistor 48 is provided, having the source/drain path thereof connected between the positive rail 34 and the node 44. The gate of transistor 48 is connected to the node 40. The transistor 48 is labelled P$_2$. A second N-channel transistor is provided having the source/drain path thereof connected between the node 44 and the node 22. The gate of transistor 50 is connected to the node 44. A second diode 52 has the anode thereof connected to the node 22 and the cathode thereof connected to the negative rail 36. The diode 52 is labelled D$_2$.

The transistors 38, 42, 48 and 50, resistors 56 and 58 and the diodes 46 and 52 form a conventional supply independent current bias circuit. The transistors 38 and 42, resistors 56 and 58 and diode 46 provide the function of the reference leg and the transistors 48 and 50 and diode 52 provide the function of the mirror leg. The current through the transistor 38 is utilized to generate a bias voltage on the node 40, which bias voltage is connected to the gate of the transistor 48 to control the current therethrough. Therefore, the current through transistor 38 is essentially reflected over to transistor 48 such that the current through transistor 48 is equal to the current through transistor 38. Transistor 38 therefore functions as the conversion circuit 26 of FIG. 2. The transistors 42 and 50 provide the function of the voltage bias circuit 33, in that the voltage on the node 22 is reflected over to the node 28 such that the voltage on node 28 is substantially equal to the voltage on node 22. As described above, the current through the resistor 12 generates a voltage $\Delta V_{BE}$ thereacross which represents the difference in the base-emitter voltages of the two diodes 46 and 52. In the preferred embodiment, the diodes 46 and 52 are realized with a hi-polar transistor such that the forward bias voltage thereacross is the base-emitter voltage. Although the current is equal through both the diodes, there is a small difference in the base-emitter voltages, this being the voltage developed across the nodes 28 and 30 and this also being a PTAT voltage.

In the preferred embodiment, the resistor 12 is comprised of two parallel configured resistors 56 and 58, labelled R$_1$ and R$_2$, respectively. The resistors are chosen to have a value that defines the appropriate current through transistors 38 and 40 and also to provide a specific temperature coefficient. In the preferred embodiment, the voltage $\Delta V_{BE}$ between nodes 28 and 30 is approximately 3000 ppm/°C. and the overall temperature coefficient of resistors 56 and 58 is also approximately 3000 ppm/°C. As such, the temperature coefficients of the resistors 56 and 58 cancels out the temperature coefficient of the voltage $\Delta V_{BE}$, resulting in a current that has a temperature coefficient of substantially 0 ppm/°C.

The current through transistor 38 is mirrored over to a P-channel transistor 60 labelled P$_3$. Transistor 60 (P$_3$) has the source/drain path thereof connected between the positive rail 34 and a node 62, the gate thereof connected to the node 40. The transistor 60 is operable to provide a constant current to one plate of a capacitor 64, the other plate thereof connected to the negative rail 36. The capacitor 64 is part of the multi-vibrator 19. The node 62 is connected to the positive input of a comparator 66, the negative input thereof connected to a reference voltage V$_R$. The output of the comparator 66 provides an output CLK, which is the output of the multivibrator 19. Additionally, the output of comparator 66 is connected to the gate of a third N-channel transistor 68, the source/drain path thereof connected between the node 62 and the negative rail 36. In operation, whenever the output of the comparator 66 is a logic high, the transistor 68, labelled N$_3$, conduits, discharging the capacitor 64. When the capacitor 64 discharges, node 62 is pulled to the voltage of the negative rail 36 and the output of the comparator 66 goes to a logic low. When the output of comparator 66 goes to a logic low, the transistor 68 is rendered nonconductive and the current through the transistor 60 then charges up the capacitor 64. When the charge on capacitor 64 reaches a sufficient level such that the voltage level on node 62 is above the reference voltage $V_R$, the output of comparator 66 again goes to a logic high, again discharging the capacitor 64. This therefore results in a periodic waveform on the output of comparator 66, this being the output of the multi-vibrator 19. It can be seen that the frequency of the output waveform is a function of the current through transistor 60. Temperature variations in this current affect the frequency. The current source of the present invention is temperature compensated to remove this temperature variation.

From an operational standpoint, the two diodes 46 and 52 provide a bi-polar device which has a dependence on temperature of kT/q. The voltage at node 22 is the voltage across diode 52 ($D_2$) and the voltage at node 30 is the voltage across diode 46 ($D_1$). These voltages are $V_{D2}$ and $V_{D1}$, respectively. The equations for calculating $\Delta V_{BE}$ with $I_{D1}$ being the current through diode 46, $I_{S1}$ being the saturation current of diode 46, the current through diode 52 being $I_{D2}$ and the saturation current of diode 52 being $I_{S2}$ is as follows:

$$V_{D1} = \frac{KT}{q} \ln \frac{I_{D1}}{I_{S1}} \tag{3}$$

$$V_{D2} = \frac{KT}{q} \ln \frac{I_{D2}}{I_{S2}} \tag{4}$$

$$V_{D2} - V_{D1} = \Delta V_{BE} = \frac{KT}{q} \left( \ln \frac{I_{D2}}{I_{S2}} - \ln \frac{I_{D2}}{I_{S2}} \right) \tag{5}$$

$$\Delta V_{BE} = \frac{KT}{q} \ln \frac{I_{D1}I_{D2}}{I_{S1}I_{D2}} = \frac{KT}{q} \ln \frac{I_{S2}}{I_{S1}} \tag{6}$$

It can be seen that the relationship is the natural logarithm of the ratio of the saturation current $I_{S2}$ and the saturation current $I_{S1}$, since the currents $I_{D1}$ and $I_{D2}$ are equal. The saturation currents are a function of the size of the diodes 46 and 52. In the preferred embodiment, these diodes are ratioed by a factor of eight, with diode 46 having an area that is eight times the area of the diode 52. This results in the ratio of $I_{s2}/I_{s1}$ being equal to eight, resulting in the following equation:

$$\Delta V_{BE} = \frac{KT}{q} \ln(8) \tag{7}$$

Although a resistance was disposed between the nodes 28 and 30, it should be understood that any type of impedance can be disposed between these two nodes. This impedance could be a transconductance and could be an inherent part of the transistor 42. However, it is important that some type of resistance be disposed between nodes 28 and 30 that has a temperature coefficient that is controllable. Without this resistance, the circuit would collapse and would not operate.

Figure 4:
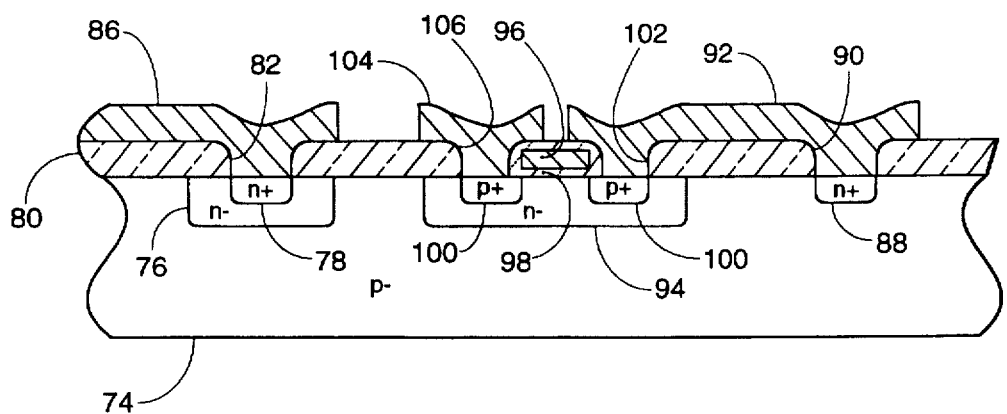
FIG. 4 illustrates a cross-sectional view of one embodiment for realizing the temperature compensated current source of the present invention and the associated resistors.

Referring now to FIG. 4, there is illustrated a cross-sectional view of the resistors 56 and 58 of FIG. 3, which resistors are fabricated in an integrated circuit. In the preferred embodiment, the resistor 56 ($R_1$) has a temperature coefficient of approximately 1500 ppm/°C. and the resistor 58 ($R_2$) has a temperature coefficient of approximately 6000 ppm/°C. The values of the resistors are selected such that the total temperature coefficient is approximately 3000 ppm/°C. The resistor R1 has a lower temperature coefficient and is generally fabricated as N+ material in a P– substrate, whereas the high temperature coefficient resistor, resistor 58, is fabricated with N– material in a P– substrate.

In FIG. 4, a P– substrate 74 is provided with an N– region 76 disposed therein. The N– region has an impurity concentration that is less than that associated with an N+ concentration, this being a heavily doped region. However, the doping level in the region 76 must be sufficient, such that it constitutes N-type semiconductor material. An N+ contact region 78 is formed at the surface of the N– region 76, this allowing a contact area. This is a conventional processing technique. Typically, after forming the N– region 76 with the use of ion implantation techniques of the appropriate impurities, a layer of interlevel oxide 80 is disposed over the substrate. A via 82 is then formed through the interlevel oxide in the region of the N– region 76. A layer of polysilicon or similar conductive material is then disposed over the substrate and patterned to form an interconnect 86. Although illustrated in cross-section, the N– region 76 is typically a long strip, the length and width thereof defining the resistance, as resistance is typically defined in "squares".

The lower temperature coefficient resistor 56 ($R_1$) is fabricated with a lower resistivity N+ region 88 that is formed in the substrate 74. The N+ region 88 is formed with an ion implant step that results in a higher dosage implant as compared to the implants that are utilized the region 76. The interlevel oxide layer 80 is then deposited and a via 90 formed therethrough to expose a portion of the N+ region 88. The N+ region implant 88 again is shown in cross-section, with the overall structure being a strip with the via 90 only disposed at one side of the strip 90. Another point along the strip 90 will also have a via formed therein for the other connection to the respective resistor, this also being the case with the N– region 78. After the via 90 is formed, an interconnect 92 is formed from the polysilicon layer that was utilized to form the interconnect 86.

During processing, transistors are also be formed. The N-channel device is formed by first forming an N– well 94, which is formed at the same time as the N– region 76. Thereafter, a gate electrode 96 is disposed over a thin layer of gate oxide 98. A self-aligned P+ implant is then formed on either side of the gate 96 to form the source/drain implant regions 100 on either side of the gate 96. This step forms P+ regions within the N– well 94. The interconnect 92 is connected to one of the P+ regions 100 through a via 102, and the other P+ region 100 is interfaced with an interconnect 104 through a via 106. In a similar manner, a P-channel device is formed by forming a gate electrode over a layer of gate oxide, this being formed directly over the surface of the P– substrate 74. Thereafter, the source/drain implants of an N+ dopant level are formed therein, these source/drain implants formed at the same time that the N+ region 88 is formed.

By sizing the length and width of the regions 76 and 88, the size of the respective resistors can be determined. By utilizing two different temperature coefficients, a specific temperature coefficient can be determined, which is also the resultant temperature coefficient of the two resistors.

Although the preferred embodiment has been described in detail, it should be understood that various changes, substitutions and alterations can be made therein without departing from the spirit and scope of the invention as defined by the appended claims.

What is claimed is:

1. An integrated circuit temperature compensated oscillator driving circuit, comprising:

a voltage generator for generating a substantially constant voltage that has an integral variation as a function of temperature;

an impedance device integrally formed with said voltage generator having the substantially constant voltage impressed thereacross to define the current drawn therethrough, said impedance device varying in value as a function of temperature;

a current mirror for mirroring the current through said impedance device to a current source, the current through said current source directly proportional to the current through said impedance device;

wherein said substantially constant voltage has a first temperature coefficient associated therewith and said impedance device has a second temperature coefficient associated therewith, said first and second temperature coefficients having the same polarity;

wherein said first and second temperature coefficients are substantially equal, such that the current through said impedance device has a substantially zero temperature coefficient; and a current controlled oscillator for being driven by said current from said current source to output a periodic waveform having a frequency that varies as a function of said current such that temperature variations in said current from said current source cause a corresponding temperature variation in said frequency.

2. The driving circuit of claim 1, wherein said impedance device comprises a resistor.

3. The driving circuit of claim 2, wherein said resistor is comprised of the first resistor having a first temperature coefficient and a second resistor disposed in parallel therewith having a second temperature coefficient.

4. The driving circuit of claim 1, wherein said voltage generator comprises a supply independent current bias circuit for generating a current bias output for mirroring to said current source, said current bias circuit comprising:

a reference leg having a first diode associated therewith and for supplying a first current to said first diode;

an output leg having a second diode associated therewith and for supplying a second current to said second diode;

said impedance device disposed in series with said first diode with one side thereof connected to one terminal of said first diode;

a current mirror device for mirroring said first current to said second current such that said first and second currents are substantially equal; and a bias circuit for translating the voltage on said second diode to the other side of said impedance device, the voltage across said impedance device constituting said substantially constant voltage.

5. A method for temperature compensating an integrated circuit oscillator driving circuit, comprising:

generating a substantially constant voltage with a voltage generator circuit that varies as a function of temperature with a first temperature coefficient;

impressing the substantially constant voltage across an impedance device that is integrally formed with the voltage generator circuit having a second temperature coefficient to drive a current therethrough, the level of the current defined by the impedance device, the impedance device varying in value as a function of temperature and the first and second temperature coefficients having the same polarity, and the first and second temperature coefficients being substantially equal;

mirroring the current through the impedance device to a current source, the current through the current source directly proportional to the current through the impedance device; and driving a current controlled oscillator device with the current from the current source to output a waveform having a frequency proportional to the current through the current source such that a variation in the current as a function of temperature results in a corresponding variation in the frequency of the waveform as a function of temperature.

6. The method of claim 5, wherein the step of impressing the substantially constant voltage across an impedance device comprises impressing the substantially constant voltage across a resistor.

7. The method of claim 6, wherein the step of impressing the substantially constant voltage across the resistor comprises impressing the substantially constant voltage across first and second resistors disposed in parallel, each of the first and second resistors having a different temperature coefficient, the combination of the temperature coefficients of the first and second resistors providing the resultant second temperature coefficient.

* * * * *